US006407678B1

(12) United States Patent
Elgee et al.

(10) Patent No.: US 6,407,678 B1
(45) Date of Patent: Jun. 18, 2002

(54) BELT MEDIA DRIVE FOR PRINTER WITH DUAL BELT ENCODERS

(75) Inventors: Steven B Elgee, Portland, OR (US); Jeffrey C. Madsen, Vancouver; Steven P Downing, Camas, both of WA (US)

(73) Assignee: Hewlett-Packard Company, Palo Alto, CA (US)

( * ) Notice: Subject to any disclaimer, the term of this patent is extended or adjusted under 35 U.S.C. 154(b) by 67 days.

(21) Appl. No.: 09/584,021

(22) Filed: May 30, 2000

(51) Int. Cl.[7] .................................................. H03M 1/22
(52) U.S. Cl. ........................................... 341/8; 400/279
(58) Field of Search ............................ 341/8, 9, 11, 13; 250/231.14, 231.13, 231.18; 399/301; 347/340, 37, 39

(56) References Cited

U.S. PATENT DOCUMENTS 5,946,537 A  *  8/1999  Nakayasu et al. .......... 309/301
6,043,483 A  *  3/2000  Schreiber ............... 250/231.13
6,215,119 B1 *  4/2001  Markham et al. ...... 250/231.14
6,268,601 B1 *  7/2001  Juniman ................ 250/231.13

* cited by examiner

Primary Examiner—Peguy JeanPierre
Assistant Examiner—Joseph Lauture

(57) ABSTRACT

An encoding system is described for a media handling system including an endless belt. The encoding system includes encoding indicia associated with the endless belt. A first encoder transducer is responsive to the encoding indicia to provide a first encoder signal. A second encoder transducer is responsive to the encoding indicia to provide a second encoder signal, the second encoder transducer spatially separated from the first encoder transducer. An encoder processor is responsive to the first encoder signal and the second encoder signal to determine position data regarding the endless belt. Interruption of indicia due to a belt seam is accommodated by transferring belt position calculation from one transducer to the other as the seam passes between the two transducers. The processor is adapted to compensate for variations in the encoder indicia pitch caused by belt temperature differentials.

20 Claims, 4 Drawing Sheets

FIG. 3
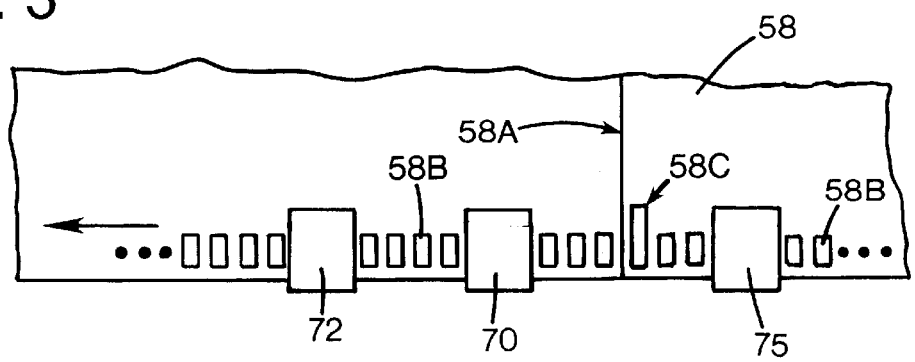
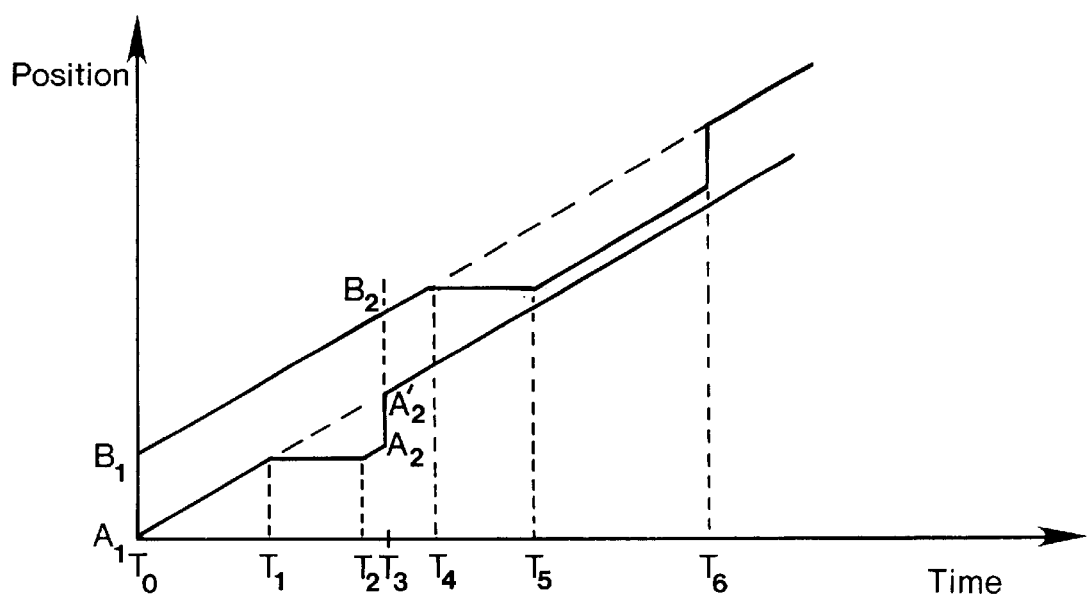
FIG. 4

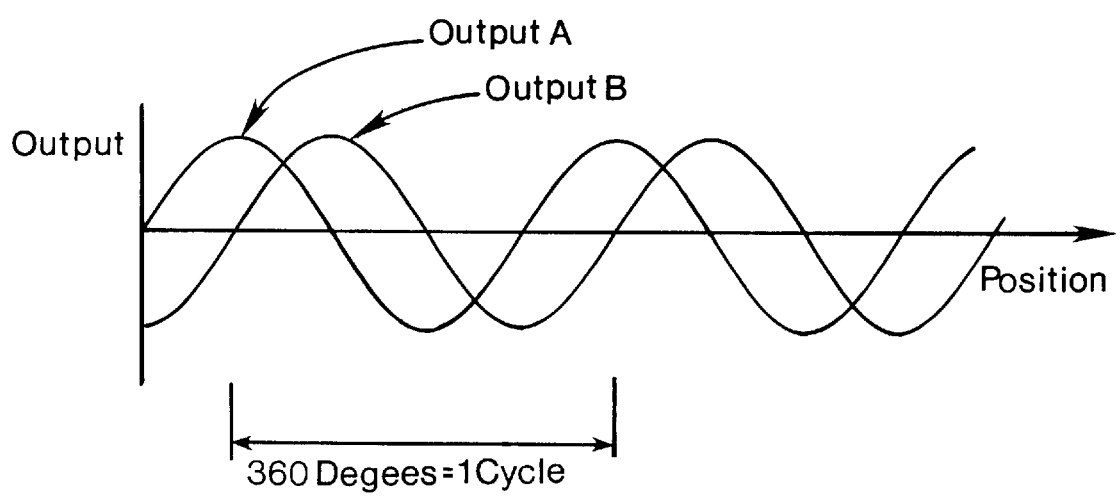

BELT MEDIA DRIVE FOR PRINTER WITH DUAL BELT ENCODERS

TECHNICAL FIELD OF THE INVENTION

This invention relates to printers, and more particularly to encoding systems for media advance systems.

BACKGROUND OF THE INVENTION

Printers, such as ink-jet printers, can typically employ a media drive system to advance the print media along a media path through a print zone. The print zone in a typical ink-jet printer is located beneath the nozzles of the ink-jet print cartridges. For swath-type printers, the print cartridges are typically mounted on a carriage which moves along a carriage scan axis transverse to the media path, and ink droplets are ejected in a controlled fashion as the carriage is driven.

Accurate control of the carriage drive and the media advance is needed to achieve good print quality. If the media and the print elements cannot be accurately positioned while the ink droplets are ejected onto the media, the image quality will degrade. To achieve accurate control of the carriage drive, an encoder system is typically used to monitor carriage motion and position in response to commanded motor-driven movements.

This invention addresses problems associated with the accurate media positioning with a belt drive.

SUMMARY OF THE INVENTION

In accordance with an aspect of the invention, an encoding system is described for a media handling system including an endless belt. The encoding system includes encoding indicia associated with the endless belt. A first encoder transducer is responsive to the encoding indicia to provide a first encoder signal. A second encoder transducer is responsive to the encoding indicia to provide a second encoder signal, the second encoder transducer spatially separated from the first encoder transducer. An encoder processor is responsive to the first encoder signal and the second encoder signal to determine position data regarding the endless belt.

According to another aspect of the invention, the processor is adapted to compensate for variations in the encoder indicia pitch caused by belt temperature differentials.

According to a further aspect of the invention, a method is described for providing belt position information for a media handling system including an endless belt having encoder indicia associated with the belt. The method includes:

reading a first encoder signal from a first encoder transducer responsive to the encoding indicia;

reading a second encoder signal from a second encoder transducer responsive to the encoding indicia, the second encoder transducer spatially separated from the first encoder transducer;

processing the first encoder signal and the second encoder signal to determine position data regarding the endless belt.

BRIEF DESCRIPTION OF THE DRAWING

These and other features and advantages of the present invention will become more apparent from the following detailed description of an exemplary embodiment thereof, as illustrated in the accompanying drawings, in which:

FIG. 3 is a diagrammatic view illustrating encoding indicia on the belt.

FIG. 4 is a graphical illustration of a technique for passing control from one belt encoder transducer to the other in accordance with the invention.

FIG. 5 is a graphical illustration of the encoder outputs from an analog quadrature encoder.

DETAILED DESCRIPTION OF THE PREFERRED EMBODIMENTS

Figure 1:
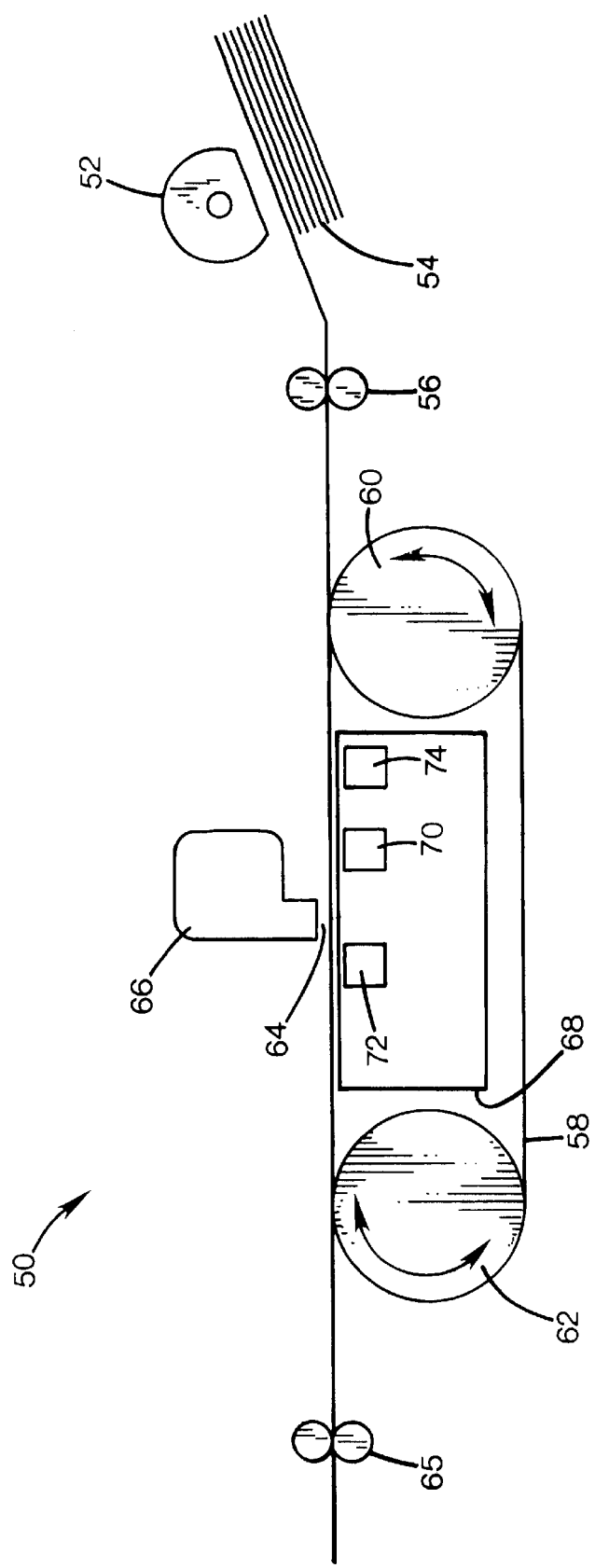
FIG. 1 is a diagrammatic side view of elements of an ink-jet printer embodying aspects of this invention.

FIG. 1 illustrates aspects of an ink-jet printer 50 using an encoded endless belt to provide the media positioning drive. A motor driven pick roller 52 is activated to pick a sheet of the print media from an input source 54, and pass it into the nip between drive roller set 56. The print media may be any type of suitable material, such as paper, card-stock, transparencies, photographic paper, fabric, mylar, metalized media, and the like, but for convenience, the illustrated embodiment is described using paper as the print medium. The invention is also applicable to roll-fed media as well.

The print medium is advanced onto an endless perforated belt or web transport 58, mounted for rotation on belt pulleys 60, 62. One or both of the pulleys 60, 62 can be selectively motor-driven in either a clockwise or counter-clockwise direction which allows the belt to move in either direction, to position the sheet relative to the print zone 65 under the printing element system or print engine, represented here by ink-jet pen 66. The print engine, for the example of an ink-jet printer, can comprise a single pen for emitting a single monochrome ink, a plurality of pens emitting ink droplets of different colored inks, a pen with multiple ink nozzle arrays for emitting a plurality of inks of different colors, by way of example. The belt or web 58 is in fluid communication with vacuum platen 68 by, for example a plurality of apertures (not shown) formed through the belt or web. In this manner, a print medium can be held against the belt 58 for the span of the length of the platen and can be moved to and from the print zone 65. The exiting sheet is passed through the nip formed by output roller set 64 to an output tray (not shown).

The invention is not limited to use in an ink-jet printer, and has utility for other types of printers and machines employing media handling systems, including, for example, facsimile machines, scanners, and multi-function machines which combine two or more functions, e.g. print, scan, copy or facsimile.

The printer 50 also includes a belt encoder system comprising a first encoder transducer 70 and a second encoder transducer 72. The belt encoder system is employed by the printer controller to precisely move the belt to position the print media, e.g. by a precise media advance distance between print swaths. Each transducer is adapted to sense encoder indicia 58B (FIG. 3) associated with the belt 58, e.g. by imprinting the indicia on the belt surface, embedding the indicia within the belt, forming an opening pattern defining the indicia, e.g.,by etching the belt material, to list a few exemplary indicia associating techniques. The transducer can be an optical sensor for optically sensing the indicia, or a magnetic transducer for sensing the indicia, by way of example. One preferred technique is to apply or etch a pattern of encoder markings along the interior belt surface in a position such that the markings pass through the field of view of optical sensors serving as the transducers 70,72. Alternative encoding techniques can also be employed, including magnetoresistive and capacitive encoding and sensing techniques. Moreover, for an optical encoder system, either transmissive or reflective systems can be employed. By way of example only, the HEDS-9700 series of optical encoder module, marketed by Agilent Technologies, Palo Alto, Calif., can be used or adapted for use in this application.

Figure 2:
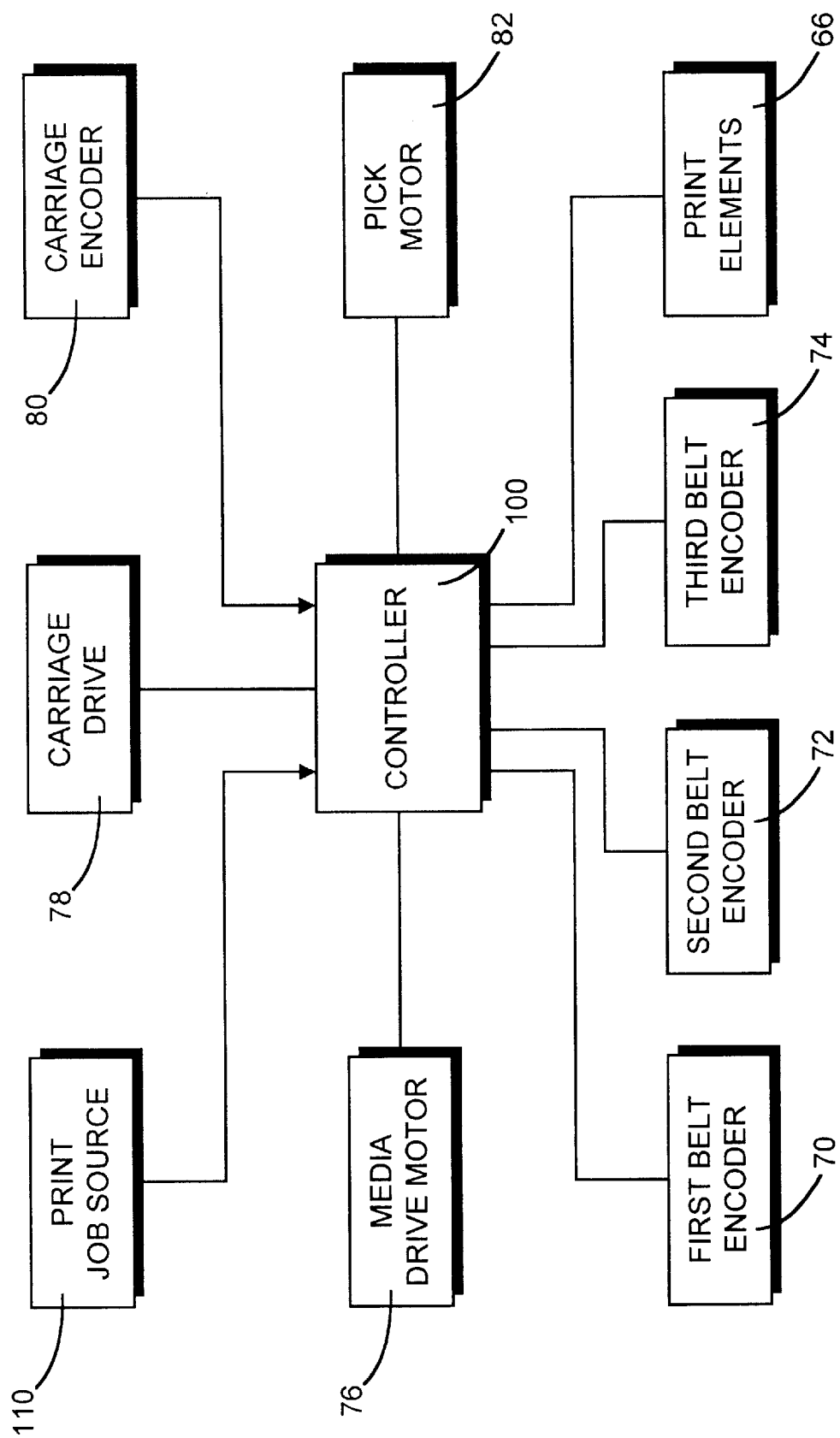
FIG. 2 is a schematic block diagram of elements of the ink-jet printer of FIG. 1.

FIG. 2 is a schematic block diagram of the control system for the printer of FIG. 1. A controller 100 such as a microcomputer or ASIC receives print job commands and data from a print job source 110, which can be a personal computer, digital camera or other known source of print jobs. The controller acts on the received commands to activate the pick roller motor 82 to pick a sheet from the input tray 54, advance the sheet to the nip between the drive roller and pinch roller set 56, and activate the drive motor system 76 to advance the sheet onto the belt 58, and drive the pulley 60 to move the belt along a media path to advance the sheet to the print zone. The carriage drive 78 is driven by the controller to position the carriage holding the printing elements 66 for commencement of a print job, and to scan the carriage in a direction transverse to the media path. As this is done firing pulses are sent to the printhead(s) comprising the pen(s) 66. The controller receives encoder signals from the carriage encoder 80 to provide position data for the carriage. The controller is programmed to advance incrementally the sheet using the media drive motor 76 and the belt 58 to position the sheet for successive swaths, and to eject the completed sheet into the output tray.

The belt in this example is provided with encoder markings or indicia spaced at an encoder pitch. If the encoded belt 58 is produced as a flat sheet and then attached end-to-end at a seam 58A (FIG. 3) to make an endless loop, it will be difficult to align the encoder markings at the seam. As a result, there can be a loss of position as the belt seam passes the encoder transducer. Moreover, if the belt encoding markings are manufactured at a different temperature than the operating temperature in the printer, the pitch of the encoding marks will change. Also, the belt temperature can vary in use in the printer, depending on the print mode and media type. The temperature differentials can result in differences in the pitch of the encoder markings, and therefore affect the accuracy of the encoder during operation.

In accordance with the invention, the controller further receives encoder signals from the two separated belt encoder transducers 70 and 72. The encoder signal from one encoder transducer, say the second encoder transducer 72, is used until the belt seam 58A is between the first and the second encoder transducers 70, 72. Then control is passed off to the first encoder transducer 70, i.e. position of the belt 58 is determined by the first transducer now "in control." When the seam passes the second encoder transducer, control is handed back to the second encoder transducer.

The condition that the seam is between the two transducers can be detected in various ways. For example, the passage of the seam past the first sensor can be detected when the first transducer output indicates no belt movement, while the second transducer output indicates belt motion. Another technique is to add another indicia, an index indicia 58C, to the belt 58 and near the seam 58A. The index indicia 58C can provide a clear signal of the arrival of the belt seam. Typically, optical encoder transducers are provided with two channels, which provide quadrature outputs, and an index channel for detecting an index mark. In this event, the index channels of transducer 70 and/or 72 can be used to detect the index indicia 58C. Another alternative is to use a third sensor 74 (FIGS. 3 and 4) to sense the index indicia 58C.

In order to perform the handoff from one transducer to the other, there are several options. With one exemplary option, as the belt is moving, the position is read using both encoder transducers with an insignificant delay between the two position reads. At an exemplary belt movement rate of 20 inches per second, and an error of 0.000050 inch, the time delay would need to be no larger than the ratio of the error and the movement rate, or 2.5 $\mu$seconds in this example.

FIG. 4 graphically illustrates the first option for handing off control from one transducer to the other transducer. Position data from the first transducer 70 is indicated as A__, and position data from the second transducer 72 is indicated as B__. Initially, at time T0, transducer 70 reads position A1 and transducer 72 reads position B1. The second transducer 72 is used for providing the belt position during time T0–T3. When the belt seam reaches the first transducer 70 at time T1, the position A1 stops incrementing, even though the belt is still moving, as illustrated by the position data B from the second transducer 72. The seam passes the first transducer during the time interval between T1 and T2, at which time the transducer 70 output starts incrementing again. Control is passed from transducer 72 to transducer 70 at time T3. The seam is passing between the two transducers between times T3 and T4. At time T4, the seam reaches the second transducer 72, and its output stops incrementing between T4–T5. At T5, the seam has passed the second transducer 72, and its output again starts incrementing. Control is handed back to transducer 72 from transducer 70 at time T6.

At the handoff time T3 (FIG. 4), the position A2 read by the first transducer 70 will need to be corrected to A2'=B2−(B1−A1), where B2 is the second encoder position at T3, and B1 and A1 are the respective transducer positions at T0. A similar correction process will be performed at the handoff from transducer 70 to transducer 72 at time T6.

A second exemplary option is to stop the belt with the seam between the two encoders and memorize the offset between the two encoder transducers. Handoff of position control from one encoder transducer to the other then occurs as described above, taking into account the offset between the two transducers. For this option, the time between encoder transducer reads is not important.

This invention can also be used to address problems associated with the operating temperature of the belt being different from its manufacturing temperature. The belt material has associated with it a corresponding temperature coefficient of expansion (TCE). The effective pitch of the encoder indicia printed on or embedded in the belt can be estimated from the TCE and the belt temperature to provide some temperature compensation. Due to tolerances on these parameters, the compensation will have errors. A more robust technique is to use the two encoder transducers with a known separation and monitor the phase difference between the signals generated by the two encoder transducers. This technique is illustrated by the following example.

If the belt TCE is 20 parts per million per °C. (ppm/°C.), the distance between the encoders is 1 inch and the pitch of the encoder is 1/150 inch, a 10° Celsius change in the belt temperature will correspond to a belt length change of (20 ppm/°C.)×(10° C.)×(1 inch)=0.2 mils. This corresponds to about 3% of the encoder pitch or 10.8 electrical degrees.

FIG. 5 illustrates an exemplary quadrature output analog encoder transducer waveform, wherein output A and output B are provided in quadrature. FIG. 5 shows the relationship between the phase of the transducer signal and the encoder indicia pitch, in this example 1/150 inch. Each cycle is 360° in electrical phase. To calibrate the belt for hot temperature operation, the following process can be employed. After powering up the printer, record the phase difference between encoder transducers over time as the belt warms up to its operating temperature. The phase difference $\Delta\theta_C$ is the phase difference measurement between encoder transducers 70 and 72 while the belt is cold. The phase difference $\Delta\theta_H$ between encoder transducers 70 and 72 is the phase difference when the belt is at the hot operating temperature. Since the phase difference between the two transducers could vary by more than 360° over time, the phase difference is monitored as the machine warms up to keep track of the number of cycles of the phase difference. Now the "hot" encoder indicia pitch is calculated as (encoder spacing)/ (((encoder spacing)/(cold encoder pitch))-(($\Delta\theta_C$-$\Delta\theta_H$)/ 360)). The cold encoder pitch is known, and is the nominal encoder pitch for the belt.

In calculating the position of the belt during normal printing operations, the "hot" encoder indicia pitch is used by the controller at operating temperature, instead of the cold temperature pitch value. This provides a temperature compensation for differences in the indicia pitch.

An alternate technique for determining the encoder pitch at any belt temperature is to utilize the index indicia 58C and the index channels on encoder transducers 70, 72. As the index indicia 58C passes the first encoder transducer 70, the control is handed off from encoder transducer 72 to transducer 70. Encoder transducer 70 is then used to count the number of electrical cycles until the index indicia 58C passes the second encoder transducer 72. Since the distance between the two transducers is known, the pitch of the encoder marks 58B can be determined by the following relationship: (encoder spacing)/((total phase difference between indicia 58C passing transducers 70 and 72)/360°). This technique allows re-calibration as often as once per belt revolution. If additional index indicia 58C are added around the belt, the re-calibration can be done more than once per belt revolution. In practice, the re-calibration of the indicia pitch for belt temperature change should only be necessary during warm up until the belt temperature is stabilized. This technique will also compensate for variations in the encoder indicia pitch caused by factors such as belt stretching.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. An ink-jet printer, comprising:
  ink-jet printing apparatus for ejecting droplets of ink onto a print medium at a print zone during printing operations;
  a media handling system for passing the print medium along a media path through the print zone and positioning the medium for accurate printing operations, said media handling system including:
    an endless belt for carrying the print media through print zone;
    a belt drive system to drive the belt in a controlled manner;
    encoding indicia associated with the endless belt, said indicia defined in or on the endless belt;
    a first encoder transducer responsive to the encoding indicia to provide a first encoder signal;
    a second encoder transducer responsive to the encoding indicia to provide a second encoder signal, said second encoder transducer spatially separated from the first encoder transducer;
  a printer controller responsive to the first encoder signal and the second encoder signal to determine position data regarding the endless belt and control the belt drive system to position the print medium for the print operations.

2. The printer of claim 1 wherein the first encoder transducer is a first optical sensor, and the second encoder transducer is a second optical sensor.

3. The printer of claim 1 wherein the encoding indicia are a sequence of markings applied to the belt with an encoder pitch spacing, and the first transducer and the second transducer have a respective field of view and are positioned at respective first and second spaced locations such that said sequence of markings pass through the respective fields of view as the belt is moved to handle media.

4. The printer of claim 3 wherein the endless belt is fabricated with a seam, and wherein the controller is responsive to said second encoder signal to determine the belt position until the seam passes between the first and second encoder transducers, and the controller is responsive to said first encoder signal to determine the belt position until after the seam passes the second encoder transducer, wherein the controller is responsive to the second transducer to determine the belt position.

5. The printer of claim 3 wherein the endless belt has a seam transverse to a direction of movement of said indicia in relation to said transducers, and the printer further includes a seam detecting appparatus to detect an index mark associated with the belt, said processor responsive to detection of an index mark to transfer between use of said first encoder signal and said second encoder signal in the determination of the belt position.

6. The printer of claim 3 wherein the controller is adapted to compensate the pitch spacing for belt temperature differentials to provide accurate positioning of said belt at an operating temperature.

7. The printer of claim 3 wherein the controller is adapted to compensate the pitch spacing for the belt dimensional variations.

8. An encoding system for a media handling system including an endless belt fabricated with a belt seam for transporting media along a media path, comprising:
  encoding indicia defined on or in the endless belt and comprising a sequence of indicia with an encoder pitch spacing;
  a first encoder transducer responsive to the encoding indicia to provide a first encoder signal;
  a second encoder transducer responsive to the encoding indicia to provide a second encoder signal;
  said second encoder transducer spatially separated from the first encoder transducer such that the sequence of indicia successively pass the respective first and second transducers as the belt is moved to handle media; and
  an encoder processor responsive to the first and second encoder signals to determine position data regarding the endless belt, wherein the processor is responsive to said second encoder signal to determine a belt position until the seam passes between the first and second encoder transducers, and the processor is responsive to said first encoder signal to determine the belt position until after the seam passes the second encoder transducer, wherein the processor is responsive to the second transducer to determine the belt position.

9. The system of claim 8 wherein the first encoder transducer is a first optical sensor, and the second encoder transducer is a second optical sensor.

10. An encoding system for a media handling system including an endless belt fabricated with a belt seam for transporting media along a media path, comprising:

encoding indicia defined on or in the endless belt and comprising a sequence of indicia with an encoder pitch spacing, the belt seam generally transverse to a direct of movement of the sequence of indicia as the belt is moved, the encoding indicia further including an index indicia marking a position of the seam;

a first encoder transducer responsive to the encoding indicia to provide a first encoder signal;

a second encoder transducer responsive to the encoding indicia to provide a second encoder signal;

said second encoder transducer spatially separated from the first encoder transducer such that the sequence of indicia successively pass the respective first and second transducers as the belt is moved to handle media;

a seam detecting apparatus to detect an index indicia associated with the belt and generate a index signal; and an encoder processor responsive to the first and second encoder signals and the index signal to determine position data regarding the endless belt, said processor responsive to detection of the index indicia to transfer between use of said first encoder signal and said second encoder signal in the determination of a belt position.

11. An encoding system for a media handling system including an endless belt fabricated with a belt seam, comprising:

encoding indicia defined on or in the endless belt and comprising a sequence of indicia with an encoder pitch spacing;

a first encoder transducer responsive to the encoding indicia to provide a first encoder signal;

a second encoder transducer responsive to the encoding indicia to provide a second encoder signal;

said second encoder transducer spatially separated from the first encoder transducer such that the sequence of indicia successively pass the respective first and second transducers as the belt is moved to handle media; and an encoder processor responsive to the first and second encoder signals to determine position data regarding the endless belt and to phase differences between said first encoder signal and said second encoder signal to compensate for variations in the encoder pitch spacing caused by belt temperature differentials.

12. The system of claim 11 wherein the processor is adapted to apply a compensated pitch spacing in determining the position data, said compensated pitch spacing determined as (encoder spacing)/(((encoder spacing)/(cold encoder pitch))−(($\Delta\theta_C - \Delta\theta_H$)/360)), where the cold encoder pitch is the nominal encoder pitch spacing at a first temperature, $\Delta\theta_C$ is the phase difference between the respective first and second encoder signals at the first temperature, $\Delta\theta_H$ is the phase difference between the respective first and second encoder signals at an operating temperature for the compensation, and the encoder spacing is a separation distance between the first encoder and the second encoder.

13. A method for providing belt position information for a media handling system including an endless belt fabricated with a belt seam for transporting media along a media path and having encoder indicia with an encoder pitch spacing defined on or in the belt, comprising:

moving the endless belt;

reading a first encoder signal from a first encoder transducer responsive to the encoding indicia;

reading a second encoder signal from a second encoder transducer responsive to the encoding indicia, said second encoder transducer spatially separated from the first encoder transducer; and processing the first encoder signal and the second encoder signal to determine position data regarding the endless belt, including transferring between use of the first encoder signal and use of the second encoder signal to calculate a belt position in dependence on position of the seam relative to the first and second encoder transducers.

14. The method of claim 13, wherein said processing includes:

(i) processing the second encoder signal to determine the belt position until the seam passes between the first and second encoder transducers;

(ii) processing the first encoder signal to determine the belt position until after the seam passes the second encoder transducer;

repeating steps (i) and (ii)).

15. A method for providing belt position information for a media handling system including an endless belt for transporting media along a media path, the belt fabricated with a belt seam and having encoder indicia with an encoder pitch spacing defined in or on the belt, the belt further having an index indicia marking a position of the belt, comprising:

reading a first encoder signal from a first encoder transducer responsive to the encoding indicia;

reading a second encoder signal from a second encoder transducer responsive to the encoding indicia, said second encoder transducer spatially separated from the first encoder transducer;

detecting the index indicia;

processing the first encoder signal and the second encoder signal to determine position data regarding the endless belt, including transferring between use of the first encoder signal and use of the second encoder signal to calculate a belt position in dependence on detecting the index indicia indicating position of the seam relative to the first and second encoder transducers.

16. A method for providing belt position information for a media handling system including an endless belt for transporting media along a media path, the belt having encoder indicia with an encoder pitch spacing defined in or on the belt, comprising:

reading a first encoder signal from a first encoder transducer responsive to the encoding indicia;

reading a second encoder signal from a second encoder transducer responsive to the encoding indicia, said second encoder transducer spatially separated from the first encoder transducer;

processing the first encoder signal and the second encoder signal to determine position data regarding the endless belt;

compensating the pitch spacing for variations caused by belt dimensional variations, using said first encoder signal and said second encoder signal.

17. The method of claim 16, wherein said compensating the pitch spacing comprises:

detecting phase differences between a phase associated with the first encoder signal and the second encoder signal to compensate for variations in the encoder pitch due to belt temperature variations or belt stretching.

18. A media handling system, comprising:

an endless belt fabricated with a belt seam for transporting media along a media path;

encoding indicia defined on or in the endless belt and comprising a sequence of indicia with an encoder pitch spacing;

a first encoder transducer responsive to the encoding indicia to provide a first encoder signal;

a second encoder transducer responsive to the encoding indicia to provide a second encoder signal;

said second encoder transducer spatially separated from the first encoder transducer such that the sequence of indicia successively pass the respective first and second transducers as the belt is moved to handle media; and an encoder processor responsive to the first and second encoder signals to determine position data regarding the endless belt, said processor adapted to transfer between use of said first encoder signal and use of said second encoder signal to determine a belt position in dependence on a position of the seam relative to the first and second encoder transducers.

19. The system of claim 18, wherein the processor is responsive to said second encoder signal to determine a belt position until the seam passes between the first and second encoder transducers, and the processor is responsive to said first encoder signal to determine the belt position until after the seam passes the second encoder transducer, wherein the processor is responsive to the second transducer to determine the belt position.

20. The method of claim 18 wherein said compensating for variations in the pitch spacing caused by belt temperature variations includes:

applying a compensated pitch spacing in determining the position data, said compensated pitch spacing determined as (encoder spacing)/(((encoder spacing)/(cold encoder pitch))−(($\Delta\theta_C - \Delta\theta_H$)/360)), where the cold encoder pitch is the nominal encoder pitch spacing at a first temperature, $\Delta\theta_C$ is the phase difference between the respective first and second encoder signals at the first temperature, $\Delta\theta_H$ is the phase difference between the respective first and second encoder signals at an operating temperature for the compensation, and the encoder spacing is a separation distance between the first encoder and the second encoder.

* * * * *

UNITED STATES PATENT AND TRADEMARK OFFICE
CERTIFICATE OF CORRECTION

PATENT NO. : 6,407,678 B1
DATED : June 18, 2002
INVENTOR(S) : Elgee et al.

It is certified that error appears in the above-identified patent and that said Letters Patent is hereby corrected as shown below:

Column 7,
Line 6, "direct" should read -- direction --;
Line 19, "a" should read -- an --;

Column 8,
Line 20, "(ii))." should read -- (ii). --.

Signed and Sealed this

Thirteenth Day of July, 2004

JON W. DUDAS
*Acting Director of the United States Patent and Trademark Office*